United States Patent [19]
Zappella

[11] Patent Number: 5,214,261
[45] Date of Patent: May 25, 1993

[54] METHOD AND APPARATUS FOR DICING SEMICONDUCTOR SUBSTRATES USING AN EXCIMER LASER BEAM

[75] Inventor: Pierino I. Zappella, Garden Grove, Calif.

[73] Assignee: Rockwell International Corporation, Seal Beach, Calif.

[21] Appl. No.: 790,914

[22] Filed: Nov. 13, 1991

Related U.S. Application Data

[62] Division of Ser. No. 580,036, Sep. 10, 1990.

[51] Int. Cl.$^5$ .............................................. B23K 26/00
[52] U.S. Cl. ............................ 219/121.67; 219/121.83
[58] Field of Search ...................... 219/121.67, 121.72, 219/121.83; 156/643

[56] References Cited

U.S. PATENT DOCUMENTS 4,224,101 6/1980 Tijburg et al. ...................... 156/643
5,075,201 12/1991 Koh .................................... 430/321

Primary Examiner—C. L. Albritton
Attorney, Agent, or Firm—H. Fredrick Hamann; George A. Montanye; Wilfred G. Caldwell

[57] ABSTRACT

Method and apparatus for using deep ultraviolet excimer laser beams to dice semiconductor substrates, such as sapphire, with or without integrated circuitry, by establishing guided relative motion between the beam and the substrate to achieve ablative photodecomposition with the angle between the beam and the substrate being approximately five (5) degrees out of normal.

10 Claims, 10 Drawing Sheets

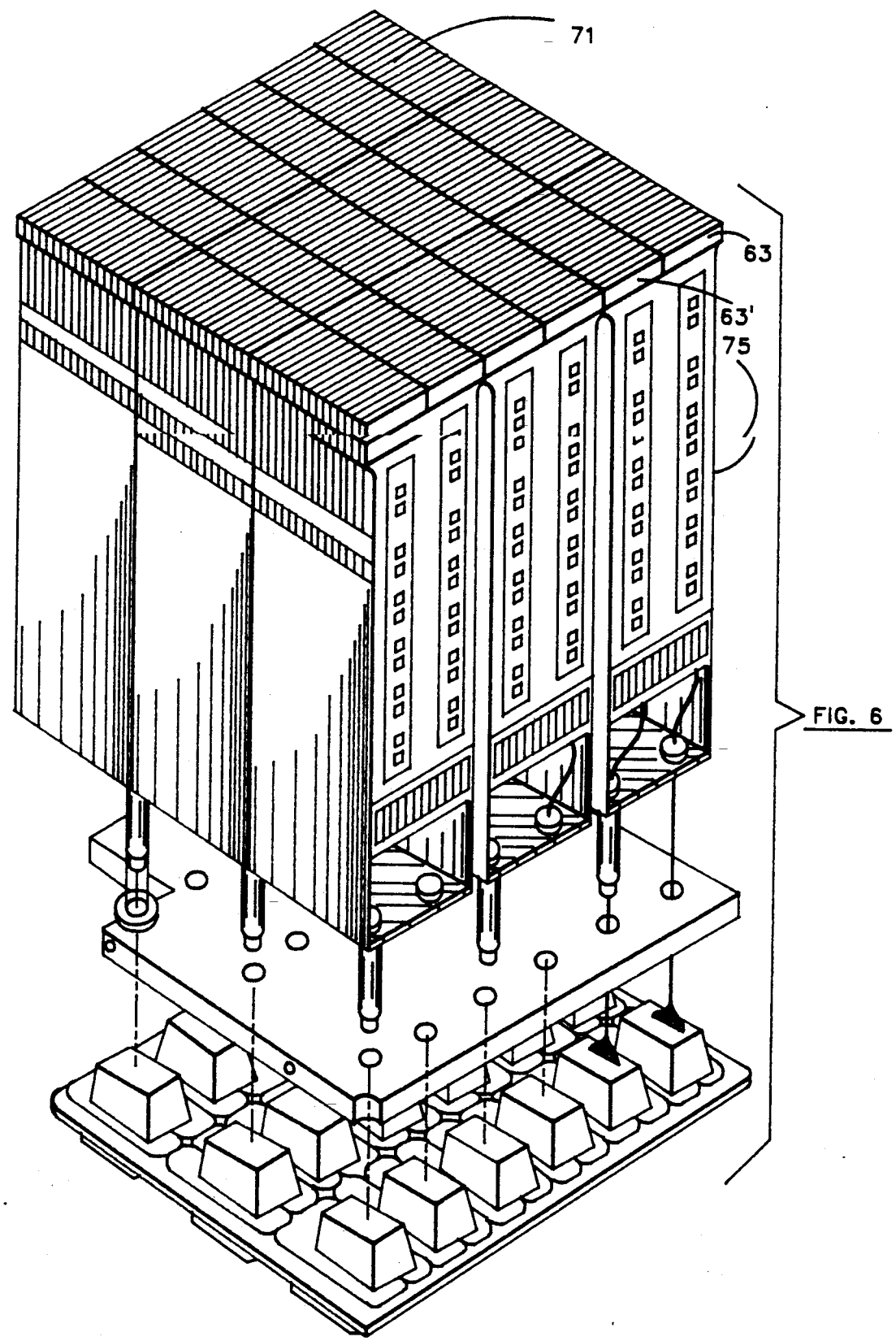

METHOD AND APPARATUS FOR DICING SEMICONDUCTOR SUBSTRATES USING AN EXCIMER LASER BEAM

This invention was made with Government support under Contract No. F04701-87-C-0023 awarded by the Air Force (Subcontract 7900003 with Grumman Aerospace Corporation). The Government has certain rights in this invention.

This is a divisional application of copending application Ser. No. 07/580,036 filed on Sep. 10, 1990.

BACKGROUND OF THE INVENTION

1. Field of the Invention

The invention relates to cutting substrates without chipping, damaging electrical components thereon, or injecting collateral heating into the substrate or components, but rather employing "bond-b-eaking" in the form of ablative photodecomposition developed by an excimer laser beam.

2. Prior Art

The current method of dicing semiconductor substrates and electrical circuitry thereon, such as mercury cadmium telluride or sapphire wafers uses a diamond grit blade dicing saw as normally used for dicing silicon wafers. However, considerable difficulty is experienced in endeavoring to achieve exact tolerances and the method is prone to chipping and fracturing, and is subject to localized friction heat of the blade, which degrades the electrical circuitry diodes or other components. The prior art is also labor and time intensive, requiring both skim and thru-cuts.

In making mercury cadmium telluride detector arrays, it is almost impossible today to dice out a die with two or four edges being parallel and normal to each other in order to afford buttability of such die with other dies to construct an array.

SUMMARY OF THE INVENTION

The invention includes a method for dicing substrates, including even sapphire, to exact tolerances without edge chipping or edge detector degradation (when a circuit is carried by the substrate). An excimer laser beam from an excimer laser operating in the deep ultraviolet bandwidth is used to supply dicing energy because it provides ablative dicing or ablative photodecomposition to supply such energy, which does not heat up the substrate and melt or destroy adjacent components. The preferred excimer laser is a xenon chloride laser operated at approximately 308 nanometers.

However, it has been found that when the plane of the wafer is kept perpendicular to the laser beam during the dicing operation, the edges of the diced part have a taper. This taper has been eliminated and the perpendicular cut is obtained by establishing a relative positioning of the beam to the substrate at 4° to 8° out of normal. Thus, in the apparatus this problem is better solved by locating the substrate on a preferred 5° tilted angle.

The apparatus comprises a focused excimer laser for developing the laser beam, control means for pulsing the laser and orienting the substrate being diced, shutter means for interrupting the beam under control of the control means, a process chamber for holding and orienting the substrate for dicing, optical means for directing the laser beam in a direction normal to the substrate, and means for tilting either the laser beam or the holding means to produce the slightly out-of-normal impact of the beam on the substrate for perpendicular cuts.

BRIEF DESCRIPTION OF THE DRAWINGS

FIG. 6 is an assembly drawing showing the association of chips or dies by pairs in the sub-module (FIG. 6a) to the module (FIG. 6b) and then to the final assembly wherein a large number of chips are butted together to form a Z plane module requiring four-side buttability of the sub-modules.

DETAILED DESCRIPTION OF A PREFERRED EMBODIMENT OF THE INVENTION

Figure 1:
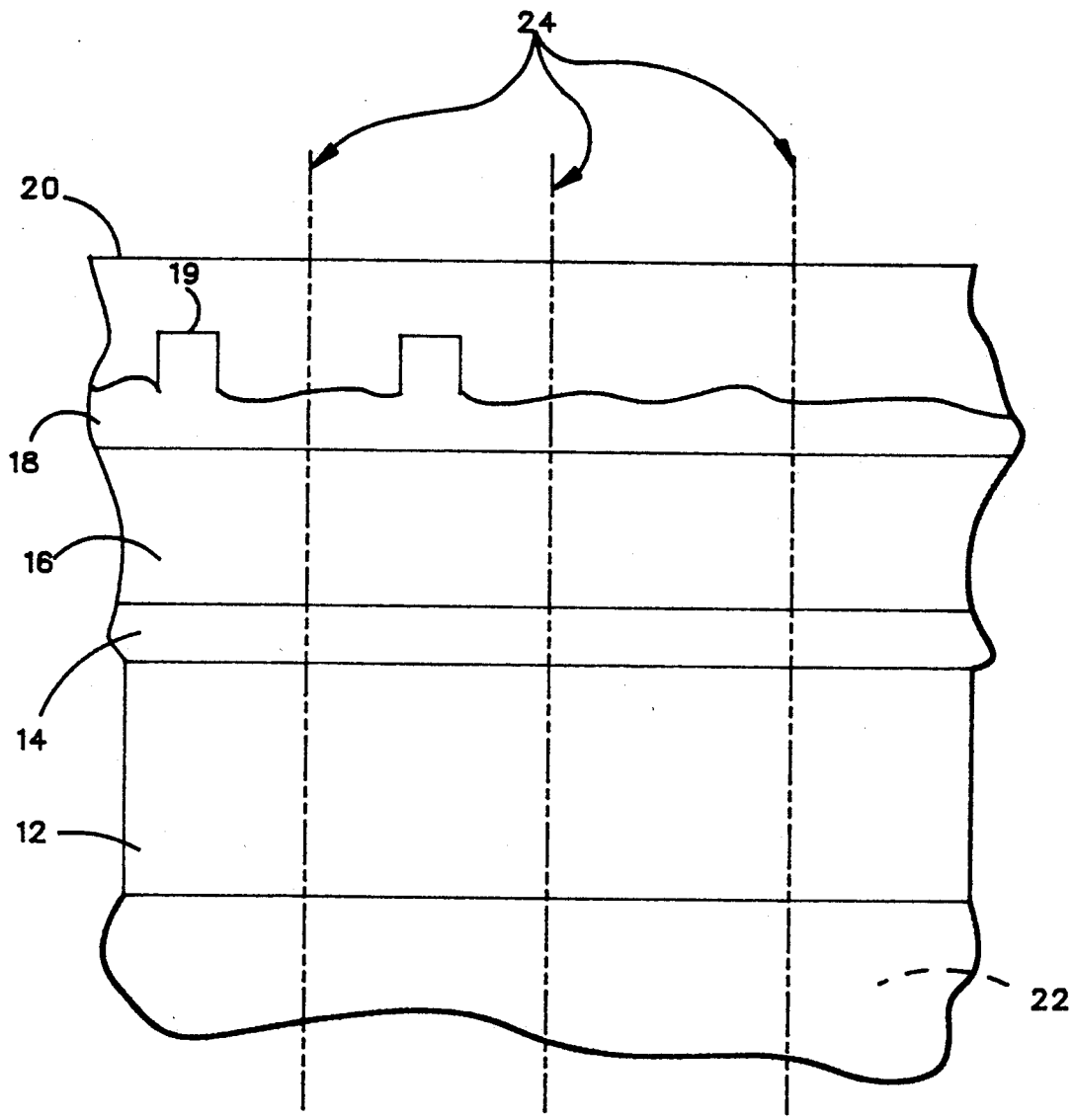
FIG. 1 is a cross-sectional view of a portion of a sapphire substrate with several layers thereon including the electrical circuitry layer and protective coatings on the top and bottom.

In FIG. 1, the preferred sapphire substrate ($AL_2O_3$). depicted at number 12, is shown with a protective coating 22 on the bottom side thereof and a layer of cadmium telluride 14 on the top thereof. The layer 14 is covered by layer 16 of mercury cadmium telluride and the circuitry is illustrated by the layer 18. Detectors 19 are visible in this circuitry for the mercury cadmium telluride detector arrays. Dash lines 24 illustrate possible excimer laser cuts to be made to slice out a die from the substrate 12 wafer. The coating 20 and 22 are the same and are optional, but they preclude "dust" from the cut from settling into the electrical circuit or onto the infrared surface to be penetrated in the back of the sapphire substrate..The optional coating is partially cured polyimide prior to laser beam dicing the wafer into discrete chips to protect against debris. The coated wafer is heated to approximately 75° C. for about 30 minutes for partial curing and protection, but it can easily be totally peeled off with alkaline solvent in an ultrasonic bath. Further details are set forth in an application filed by Jiin-Herny W. Liaw et al., May 22, 1990, entitled Laser Cutting Protective Coating and Method, which application is assigned to the same assignee as the subject application.

Figure 2:
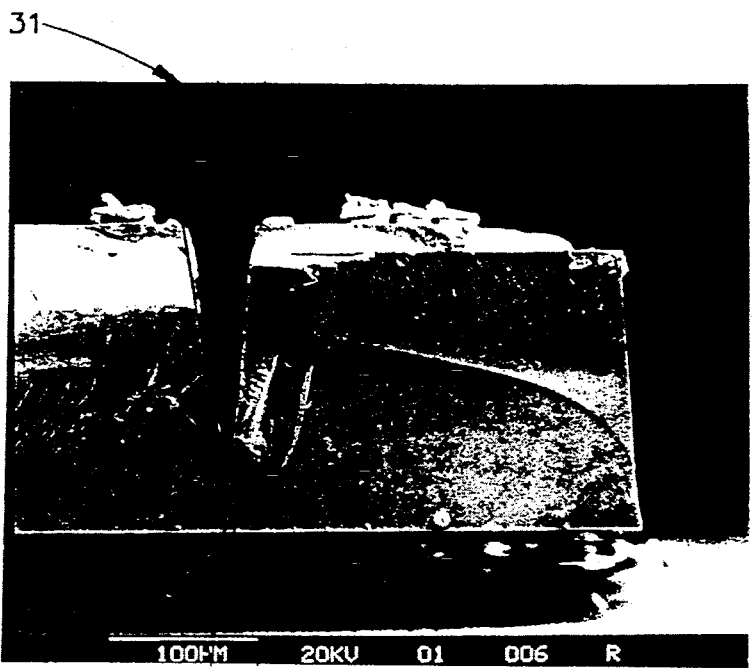
FIGS. 2 and 3 show a typical cut mace by a excimer laser beam to illustrate the undesirable taper.
Figure 3:
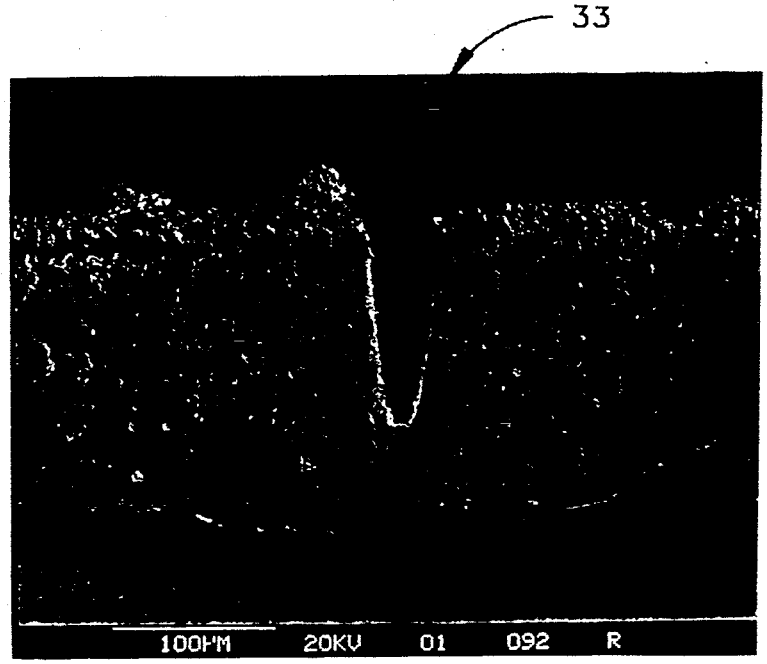

FIGS. 2 and 3 illustrate the problem with using an excimer laser dicing beam, because it bevels the edges of the array or substrate without leaving a vertical cut. This is illustrated by the laser beam cut 31 in FIG. 2 and 33 in FIG. 3. It would be impossible to use the dies cut in this manner in the structure of FIG. 6, requiring buttability of all four edges. Also, the edge pixels or electrical circuitry would be damaged by the incline caused by the beam, resulting in the fact that the beam would have to be moved further from the pixels, increasing the real estate involved per pixel.

Figure 4:
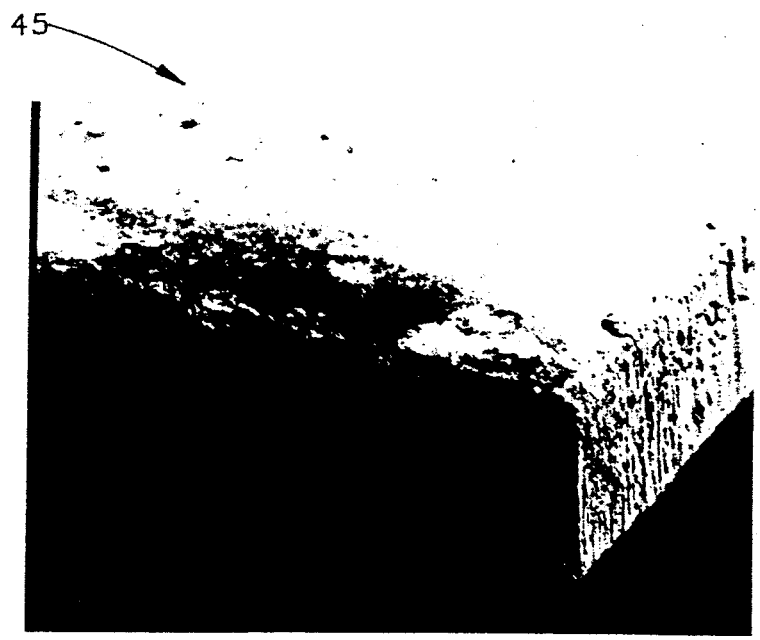
FIG. 4 is a view in perspective showing right angle cuts made in the substrate and array assembly to release a die suitable for buttable engagement.

In FIG. 4, a substrate or array 45 is shown to illustrate the fact that the visible edges are normal to the substrate or array and are linear sufficient for buttability. These cuts were made by an excimer laser utilizing the apparatus and tilt of FIG. 9.

Figure 5:
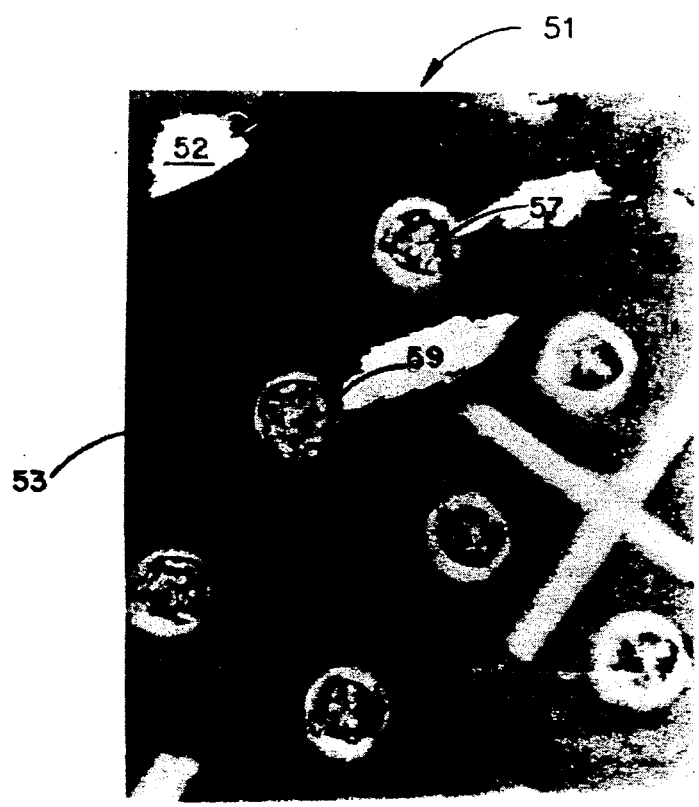
FIG. 5 is an enlarged view of a portion of a detector array in a wafer showing a cut made by the excimer laser.
Figure 10:
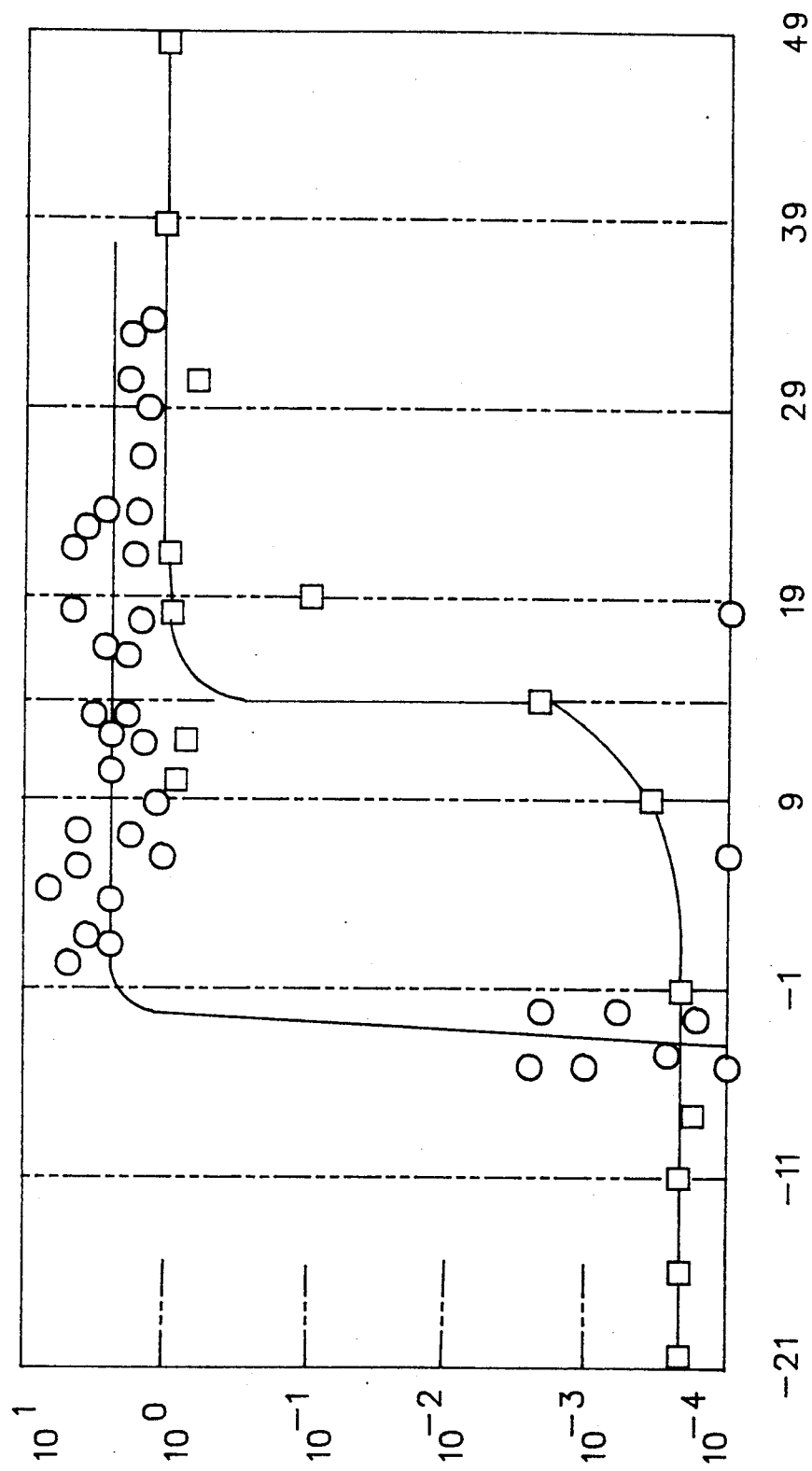
FIG. 10 shows a chart with both laser diced and mechanical saw diced groupings indicating the distance from the saw edge to edge of active area in micrometers plotted against the ratio of $R_O$ post-dicing to pre-dicing as a function of distance from optical active edge.

FIG. 5 is a close up view of a die 51 being separated from a wafer 52 by a 25 micron-wide cut 53, made by an excimer laser. The proximity of the cut to the column of pixels including pixels 57 and 59 is apparent. Reference to the chart of FIG. 10 shows that the cut is as close as six (6) microns or less to the pixels. The linearity, or straight edges, is also visible from this photograph, occasioned by the excimer cut.

Figure 6A:
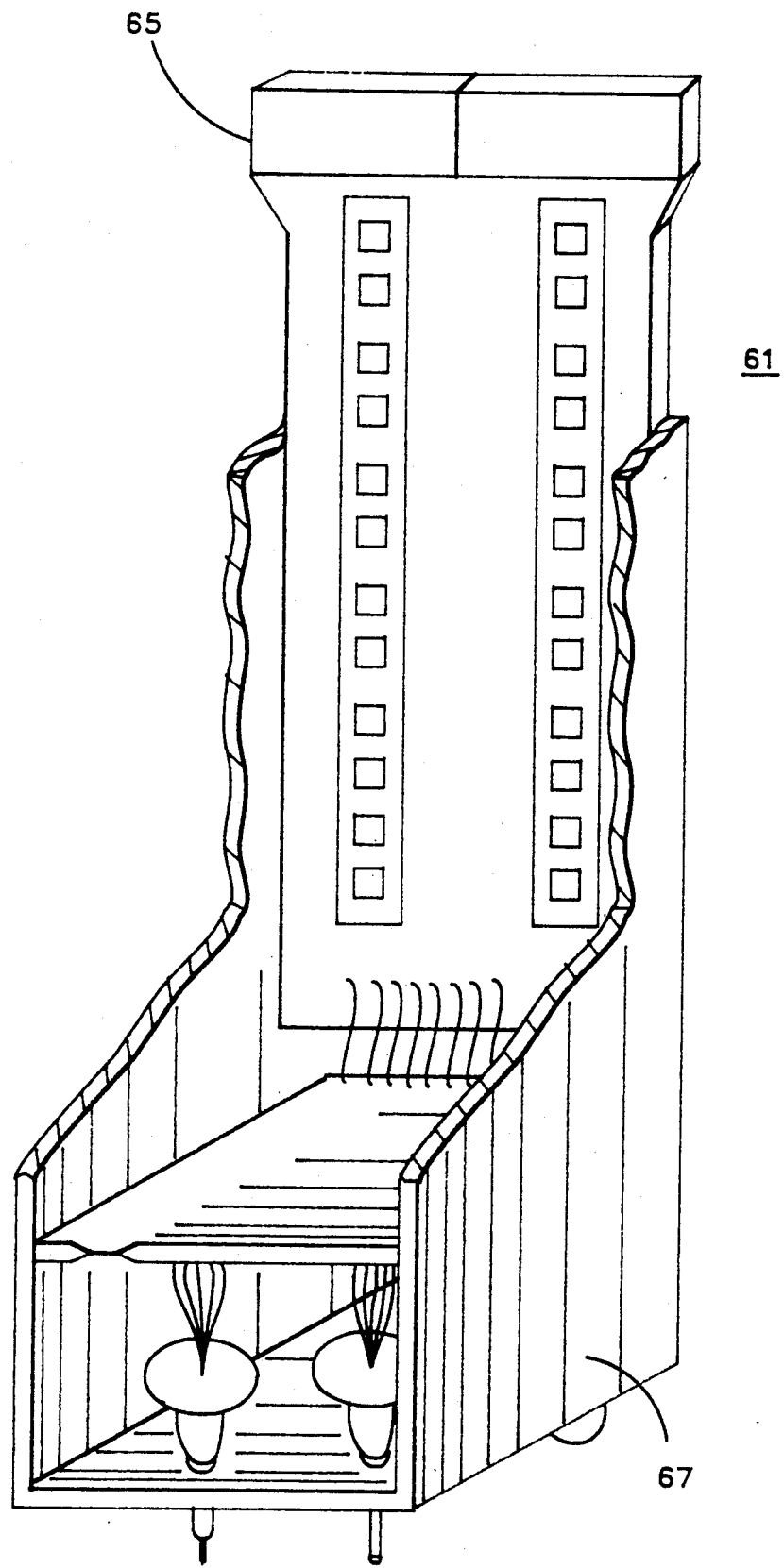
FIG. 6b is a perspective view of a module and FIG. 6a is a perspective view of a submodule of chips or dies as shown in FIG. 6.
Figure 6B:
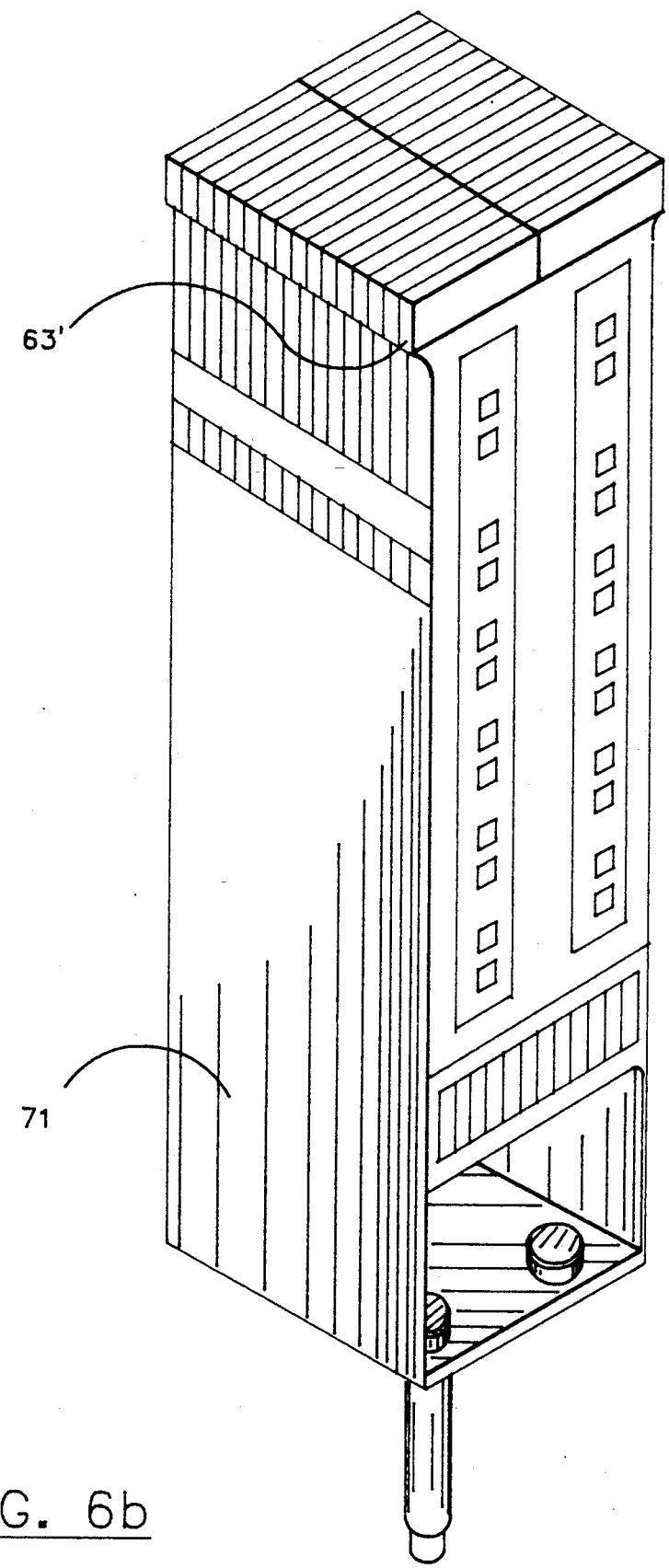
Figure 7:
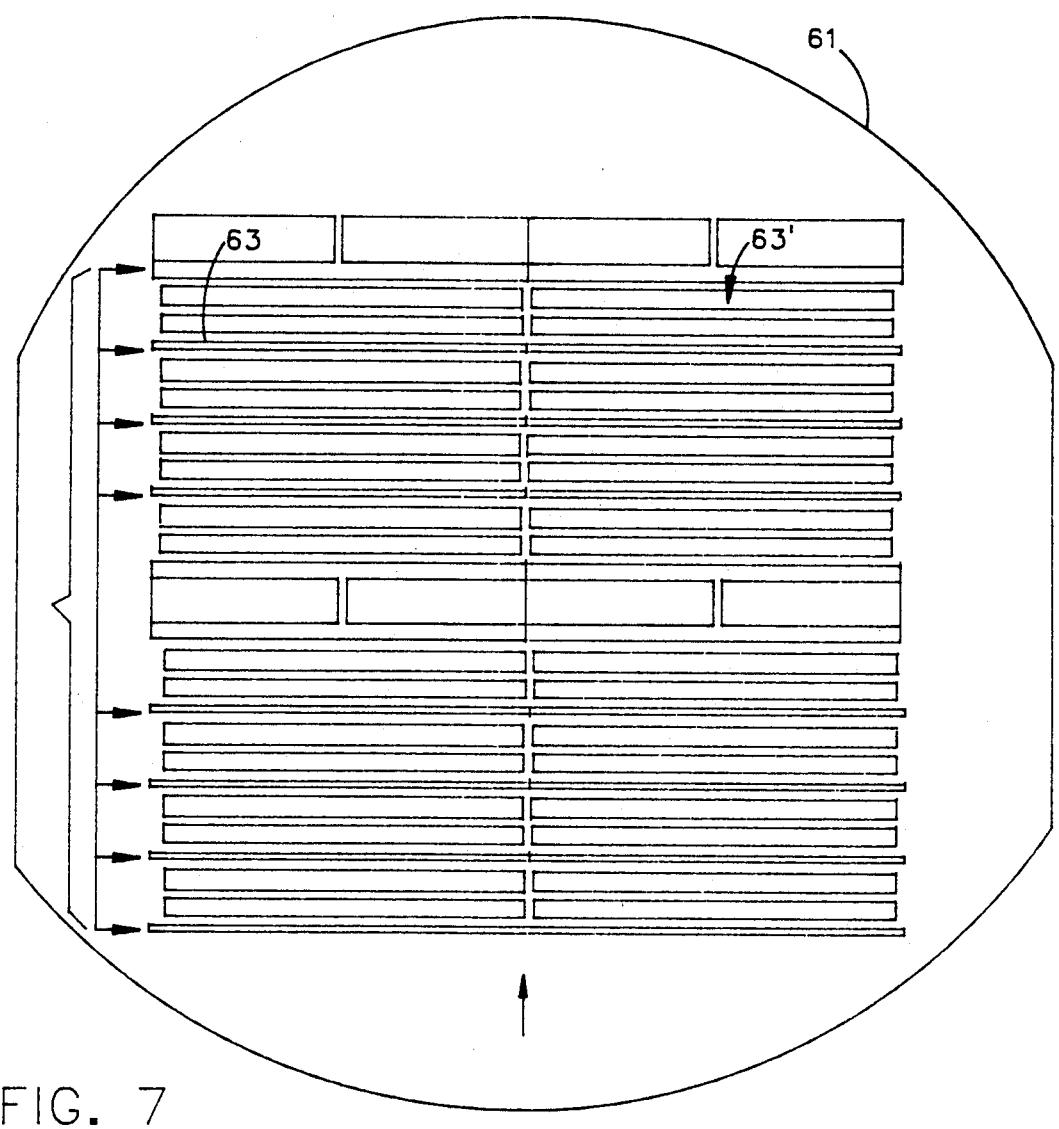
FIG. 7 is an enlarged view of a wafer with 32 detector arrays to be cut out as dies and assembled in accordance with FIG. 6.
Figure 8:
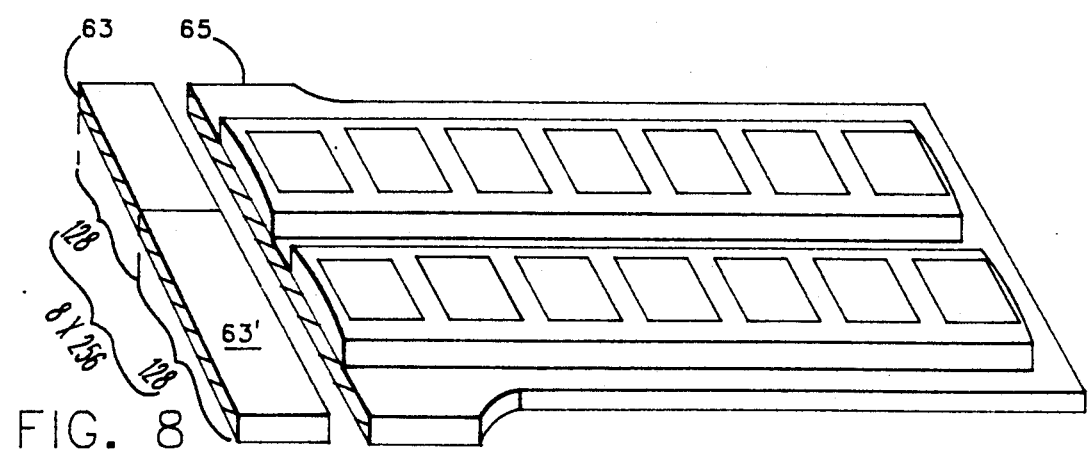
FIG. 8 shows a sub-module with the two chips or dies being assembled to the end thereof.

FIGS. 6, 7, and B show one application for dies cut from the wafer 61 of FIG. 7. This wafer includes 32 detector arrays which extend horizontally across the wafer. One die includes circuitry of 8×128 infrared detector pixels and, consequently, is long and narrow, actually being over one-half (½) inch in length. Such a die is shown at 63 in FIG. 7 and again at 63 in FIG. 8. A companion die also cut out by the excimer laser from wafer 61 is shown at 63' in both FIGS. 7 and 8, so that the card 65 receives die 63 and die 63' on the left hand edge thereof, making electrical connection to the remaining portions of circuitry on this card. Thus, the two dies together have 8×256 pixels for the submodule 67 of FIG. 6.

While the structure and connecting circuitry of FIG. 6 are unimportant, it nevertheless illustrates the fact why, for certain mounting systems, buttability of all four edges of the dies 63 and 63' is necessary. Thus, the module 71 of FIG. 6 includes a plurality of cards, each with two dies mounted on the top edge, butted together with the elongated edges meeting the requirement of buttability. Then, the final assembly 75 shows a plurality of submodules and 9 modules 71 put together, illustrating the fact that the ends of the chips must be buttable, this of course being true with respect to the chips 63 and 63', which are butted together along the top of card 65 in FIG. 8. Of course, other applications will present themselves readily for these card-mounted dies.

Figure 9:
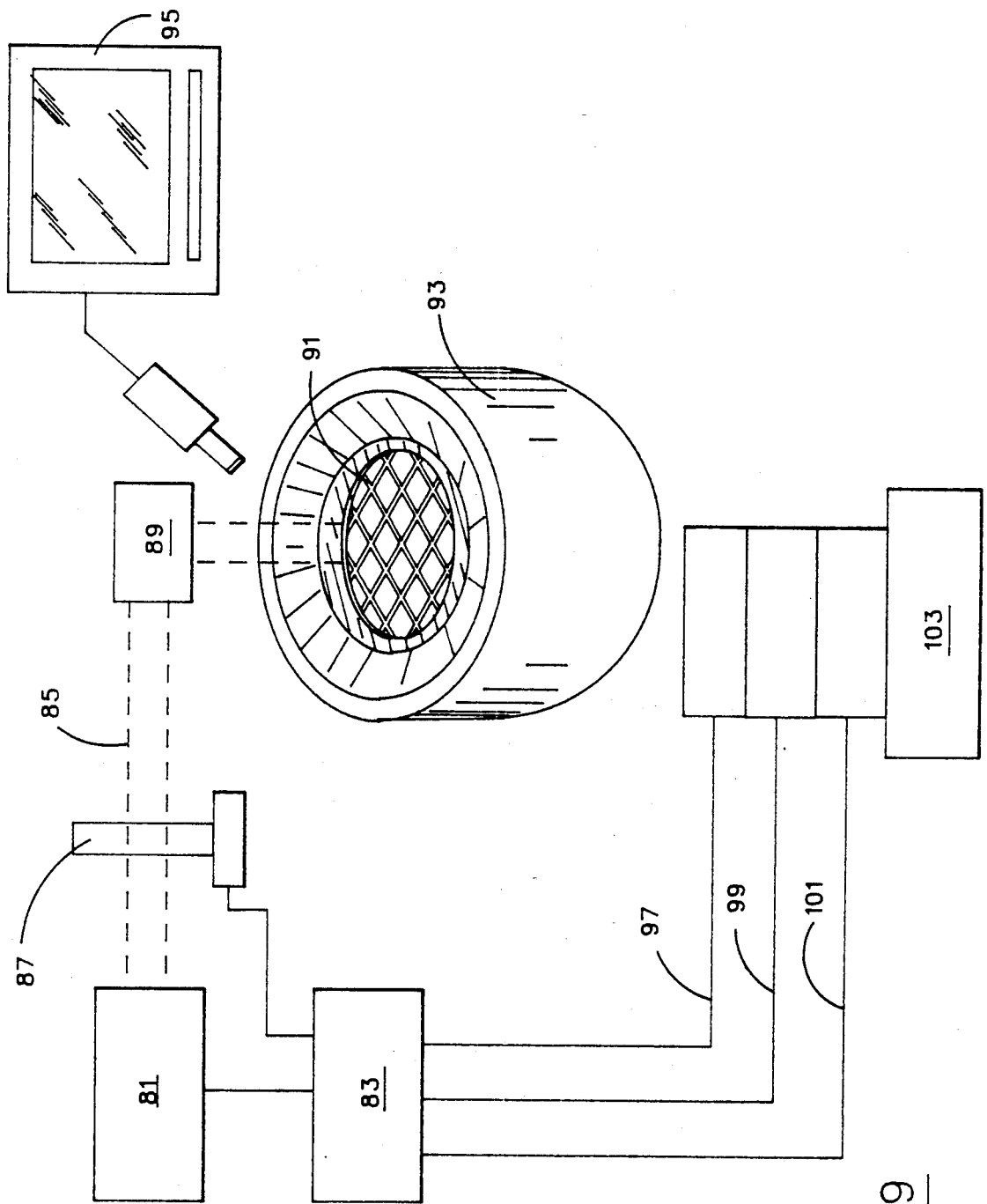
FIG. 9 illustrates the structure involved in apparatus for cutting the detector arrays or substrates by ablative photodecomposition at the appropriate tilt angle.

In FIG. 9, a suitable apparatus is shown for dicing the dies 63 and 63' from the wafer 61 of FIG. 7, at any orientation or location on the wafer. A focused xenon chloride excimer laser 81 is shown connected to computer control 83 and developing a beam 85 which passes through shutter 87 to the optics 89. The wafers shown at 91 within process chamber 93 being scanned by TV monitor 95. TV monitor 95 has a 200 to 1000 × magnification so that the cutting paths may be observed relative to the pixels.

The computer control 83 simply guides the X and Y relative motion for cutting. In this instance, the process chamber 93 orients the wafer 91 in the X and Y directions in accordance with the control path 97 from computer control 83. The same is true of the Z direction over control path 99. The $\theta$ control line 101 provides rotation control for initial alignment purposes.

The tilt adjust platform 103 serves to establish the relative displacement of the beam from normal to avoid the tapered cut. It may simply be a cam or wedge and is set for an angle of anywhere from 4° to 7° or thereabouts. Otherwise the individual components of FIG. 9 are commercially available.

In FIG. 10, it will be noted that the rectangular dots in the graph show the mechanical saw diced results versus the circles plotting the laser diced results. In the ratio ($R_O$ post) over ($R_O$ pre), where $R_O$ is a figure of merit of infrared detector performance, and ($R_O$ pre) is the value prior to dicing, and ($R_O$ post) is the value after dicing, it will be noted that the mechanical saw diced rectangular dots extend clear to the right side at a distance of +21 microns, whereas the laser diced dots begin at about −6 microns, thereby showing the vast edge pixel degradation characteristics of the mechanical saw versus the excimer laser. Note that a normalized value ratio of $10° = 1$ represents no $R_O$ value change (no degradation), and an $R_O$ of $10^{-4}$ indicates an $R_O$ degradation of 10,000(10,000 times worse or lower).

FIG. 10 implies that mechanical saw dicing requires a distance of 9 to 19 microns away from detector pixel edge without measured degradation, whereas the excimer laser dicing allows one to dice up to the pixel edge (0 microns) without degradation! To facilitate manufacturing yield, excimer laser dicing beyond the actual pixel edge by a few microns is warranted.

Figure 11:
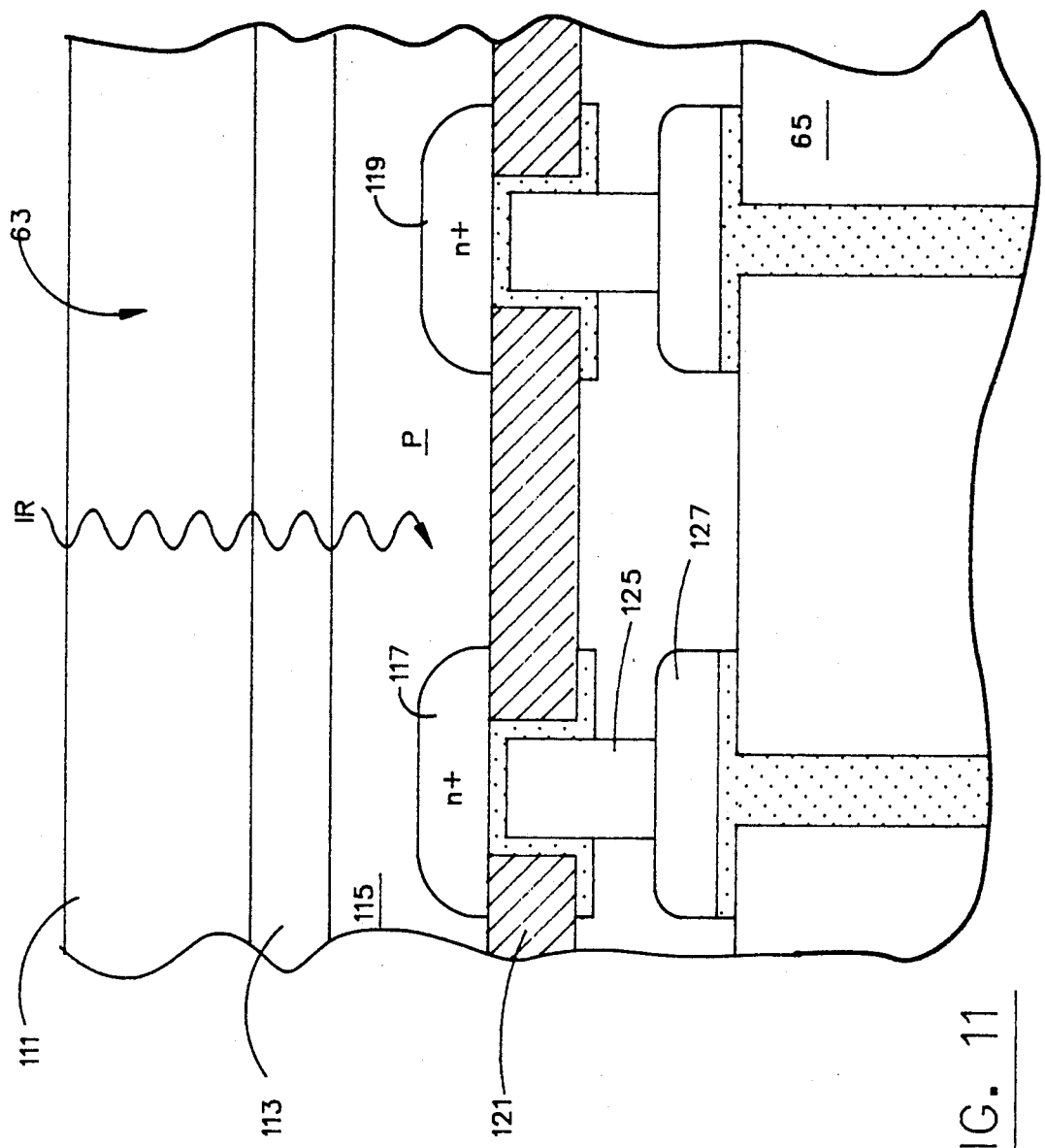
FIG. 11 is a sectional view through the detector array and supporting portion of the card; and, FIG. 11 is a sectional view through the detector array and supporting portion of the card.

FIG. 11 shows the mounting of the die 63 on card 65 for the structure of FIG. 6. The die includes sapphire substrate 111 overlaid by cadmium telluride layer 113 with mercury cadmium telluride layer 115 including spaced apart N+ diffusions 117, 119 contacted by contact metallization 121.

Indium columns e.g. 125 (also referred to as "bump") shown interconnected, are press-connected to shallow indium pads or bumps 127, which are in connection to integrated circuits carried by card 65 for readout purposes.

What is claimed is:

1. A method for dicing mercury cadmium telluride detector arrays on sapphire substrates to exact tolerances without edge chipping or edge detector degradation, comprising the steps of:
   using an excimer laser beam from an excimer laser operating in the deep ultraviolet bandwidth to supply dicing energy; and,
   establishing guided relative movement between the beam and an array to achieve ablative photodecomposition to effect said dicing.

2. The method of claim 1, further comprising:
   orienting the sapphire substrate at an angle of approximately 5 degrees out of normal to said beam.

3. The method of claim 2, further comprising:
   selecting said excimer laser as a xenon chloride laser and operating it at approximately 308 nanometers.

4. The method of claim 3, wherein:
   said substrate is oriented and laser diced sufficiently to form four buttable diced edges each within a tolerance of 0.2 to 0.5 mils. of the overall cutout die size.

5. The method of dicing detector arrays in which a detector array comprises a substrate of sapphire, a layer of cadmium telluride on the sapphire, a layer of P doped mercury cadmium telluride over the cadmium telluride containing spaced apart N+ doped diffusion regions with indium contacts extending to each diffusion region, said N+ diffusion regions to P doping each comprising a pixel with said pixels being in columns and rows normal to the columns, comprising the steps of:
  directing an excimer laser beam from an excimer laser at said array for dicing it.
  establishing a relative orientation of the array to the beam of a few degrees out of normal,
  pulsing the laser to emit energy in the deep ultraviolet range at the array; and,
  guiding one of the laser beam and array to cause the laser to dice through said substrate and layers by ablative photodecomposition along one of said columns without damaging the electrical or physical characterstics of any pixel.

6. The method of claim 5, comprising the further step of:
  applying a readily removable protective coating of polyimide to the array prior to dicing, and;
  removing said coating after dicing.

7. The method of claim 6, wherein
  the excimer laser is a xenon chloride laser operated at approximately 308 nanometers 8. Apparatus for dicing semiconductor substrates, comprising in combination:
  an excimer laser for developing a laser beam;
  control means for pulsing said laser and orienting the substrate being diced;
  shutter means for interrupting said beam under control of the control means;
  means for holding and orienting said substrate for dicing;
  optical means for directing the laser beam in a direction normal to the substrate; and,
  means for tilting one of the laser and the holding means to cause the laser beam to strike the substrate about 3 to 7 degrees out of normal, to effect normal dicing of the substrate.

9. The apparatus of claim 8, wherein:
  the excimer laser is a xenon chloride laser operating at 308 nanometers.

10. The apparatus of claim 9, wherein:
  the substrate is sapphire and supports mercury cadmium telluride infrared detector arrays;
  said arrays comprising:
  a substrate of sapphire;
  a layer of cadmium telluride on the sapphire;
  a layer of P doped mercury cadmium telluride over the cadmium telluride containing spaced apart N+ doped diffusion regions with indium contacts extending to each diffusion region; whereby
  said N+ diffusion regions to P doping each comprise a pixel with said pixels being in columns and rows normal to the columns, and said laser dices through said substrate and layers by ablative photodecomposition along one of said columns within 0 to 6 microns thereof without damaging the electrical or physical characteristics of any pixel.

* * * * *